United States Patent
Chong, Jr. et al.

(10) Patent No.: US 6,377,471 B1
(45) Date of Patent: Apr. 23, 2002

(54) DISK DRIVE INTERFACE WITH VARIABLY SPACEABLE CONNECTORS

(75) Inventors: Fay Chong, Jr., Cupertino; William L. Grouell, San Ramon, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 8 days.

(21) Appl. No.: 09/707,367

(22) Filed: Nov. 6, 2000

(51) Int. Cl.$^7$ ................................................. H05K 7/10
(52) U.S. Cl. ........................ 361/796; 361/683; 361/784; 361/788; 439/62; 439/928.1
(58) Field of Search ................................. 361/683–686, 361/752, 753, 784, 788, 792, 796, 797, 803; 439/59, 62–65, 377, 928.1

(56) References Cited

U.S. PATENT DOCUMENTS

| | | | |
|---|---|---|---|
| 5,017,146 A | * | 5/1991 | Uehara et al. ................. 439/60 |
| 5,650,911 A | * | 7/1997 | Scholder et al. ............. 361/683 |
| 5,808,876 A | * | 9/1998 | Mullenbach et al. ....... 361/601 |
| 6,091,609 A | * | 7/2000 | Hutson et al. ................. 307/43 |

OTHER PUBLICATIONS

AMP Incorporated, *CHAMP .050 Series I Blindmate, Single Connector Attachment (SCA 2) For SCSI Disk Drives*, printed on Oct. 5, 2000 from http://connect.amp.com (linked from http://www.commcon.com).

Jeff Apodaca, *Drive Docking Connectors Simplify Drive Designs*, 4 pages, printed Nov. 5, 2000 from http://www-.commcon.com/main.

Comm Con Connectors, Inc. *Disk Drive Adapters*, 2 pages, printed Nov. 5, 2000 from http://www.commcon.com/main/driveadapters.html.

* cited by examiner

*Primary Examiner*—Jayprakash N. Gandhi

(57) ABSTRACT

An apparatus and methods are provided for interfacing a disk drive to a computer system without requiring conventional power and signal cables between the apparatus and the disk drive. An interface assembly comprises a set of power connectors and a set of signal connectors for receiving corresponding connectors of a disk drive. One or more of the assembly connectors (e.g., the power connectors) are translatable in at least one dimension so that the assembly is not limited to disk drives having a particular spacing between their power and signal connectors. The interface assembly may comprise two printed circuit boards (PCB) or backplanes—one for the power connectors and one for the signal connectors. In this configuration one of the PCBs defines a set of apertures through which the connectors of the other PCB protrude, and the other PCB is slidably or otherwise translatable along a portion of the length of the first PCB so that the protruding connectors are movable within the apertures. The two PCBs may be interconnected to provide a single connection point to the host computer system or, alternatively, each PCB may connect separately. An assembly may include power and signal connectors for interfacing one disk drive or multiple disk drives and may, additionally, be configured to accept multiple disk drives having multiple different spacings between their power and signal connectors.

26 Claims, 7 Drawing Sheets

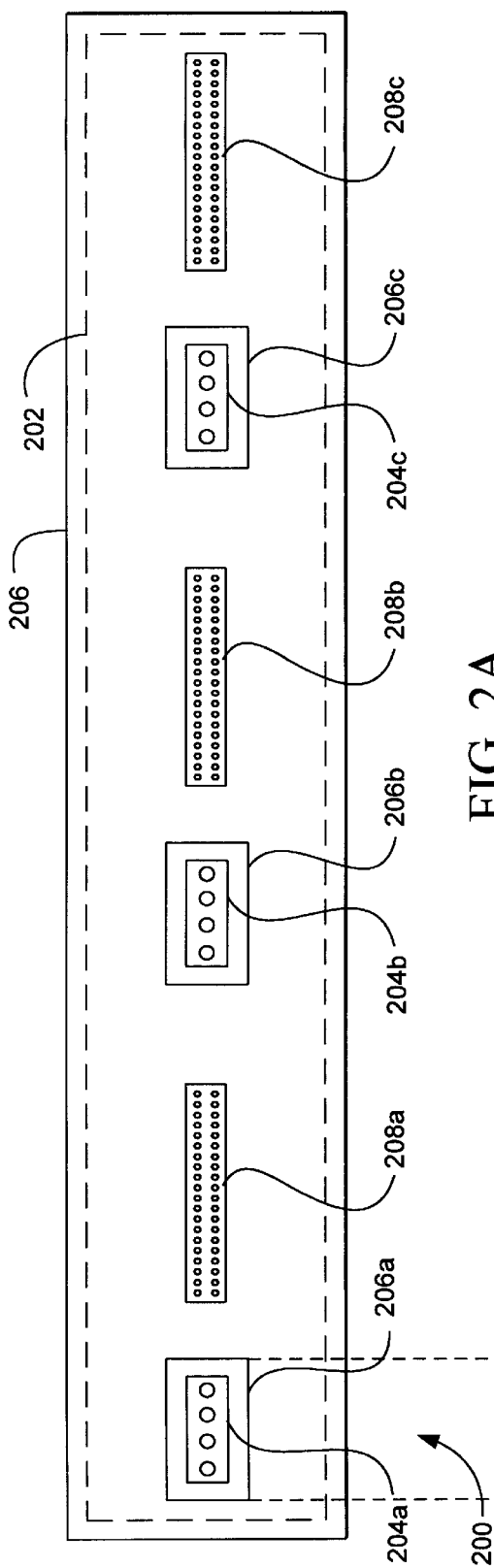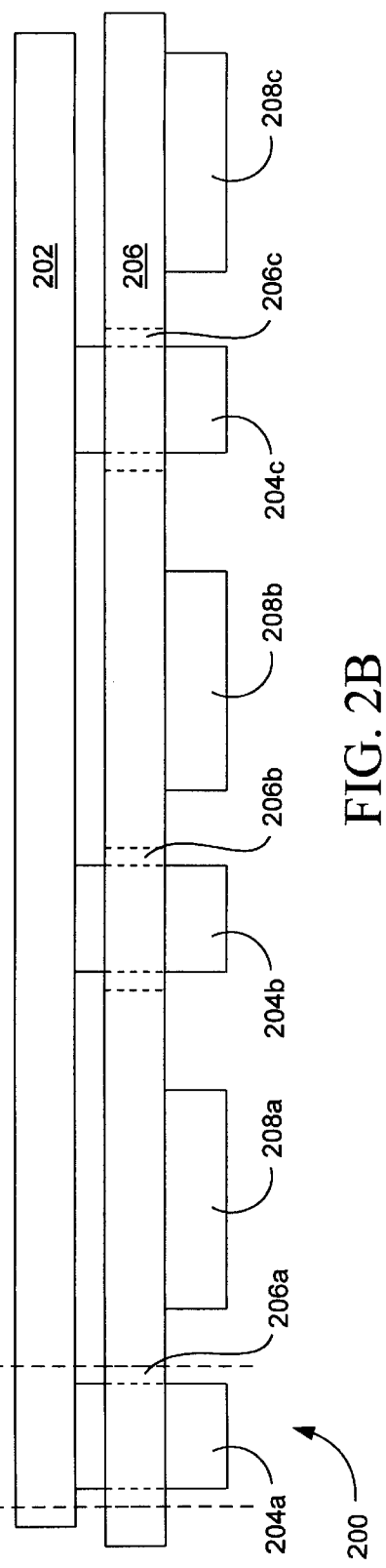

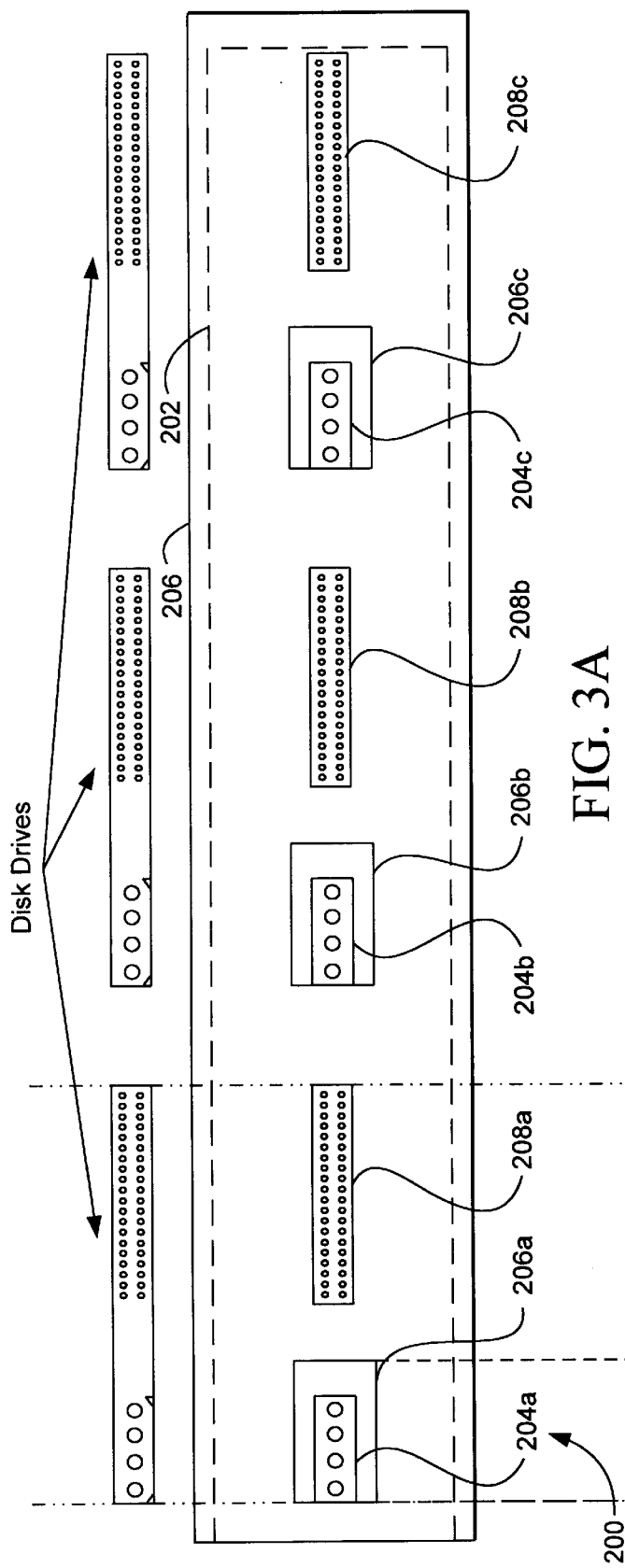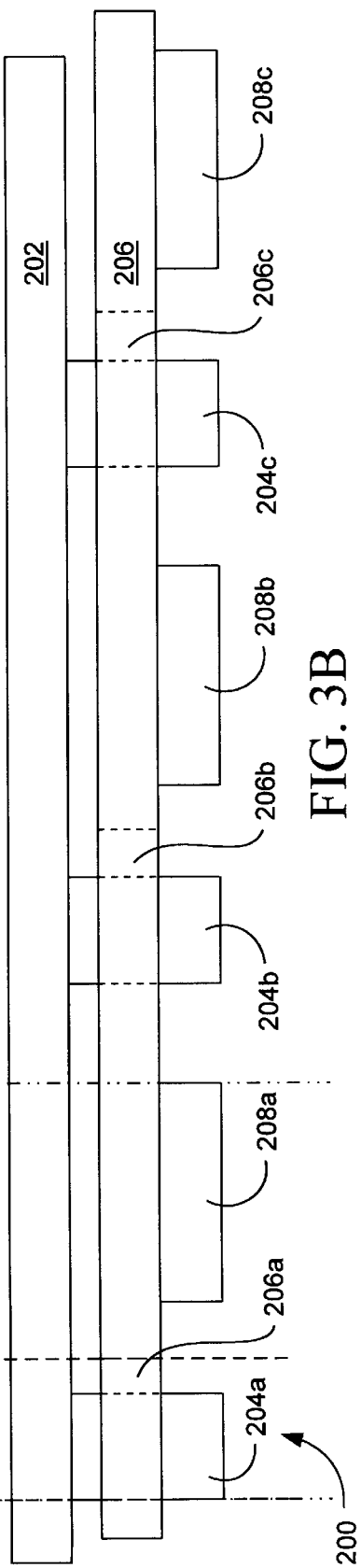
FIG. 3A
FIG. 3B

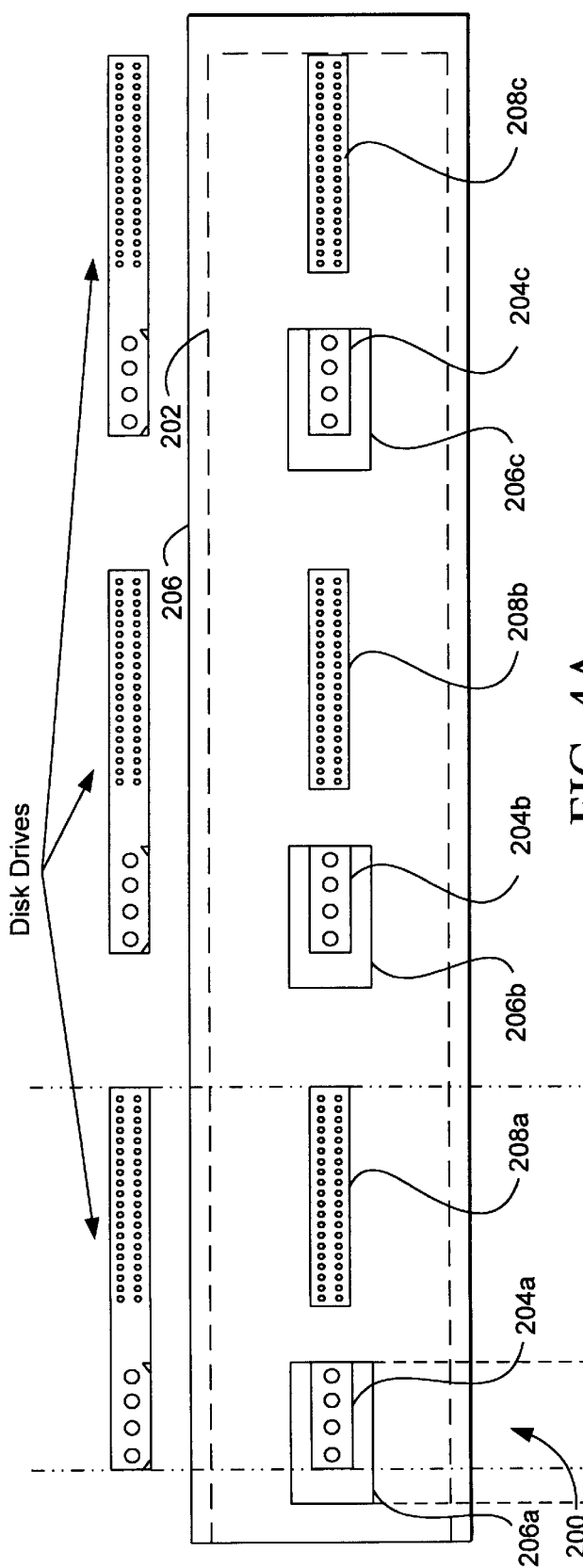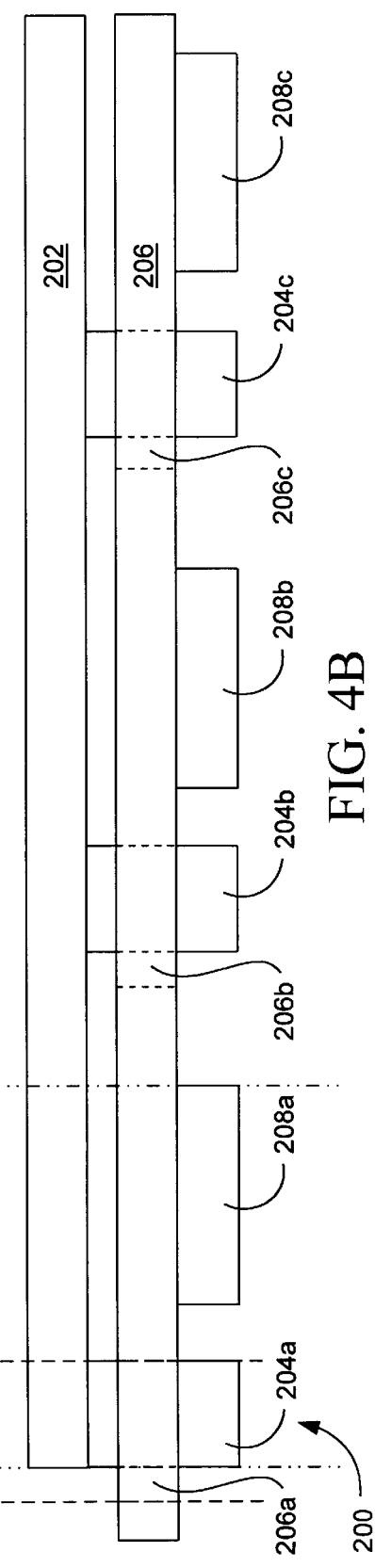
FIG. 4A
FIG. 4B

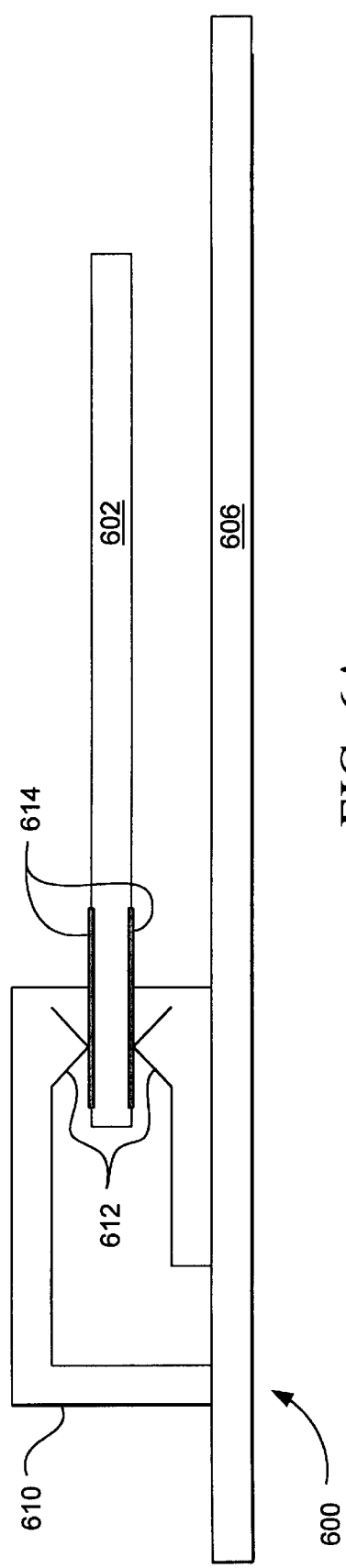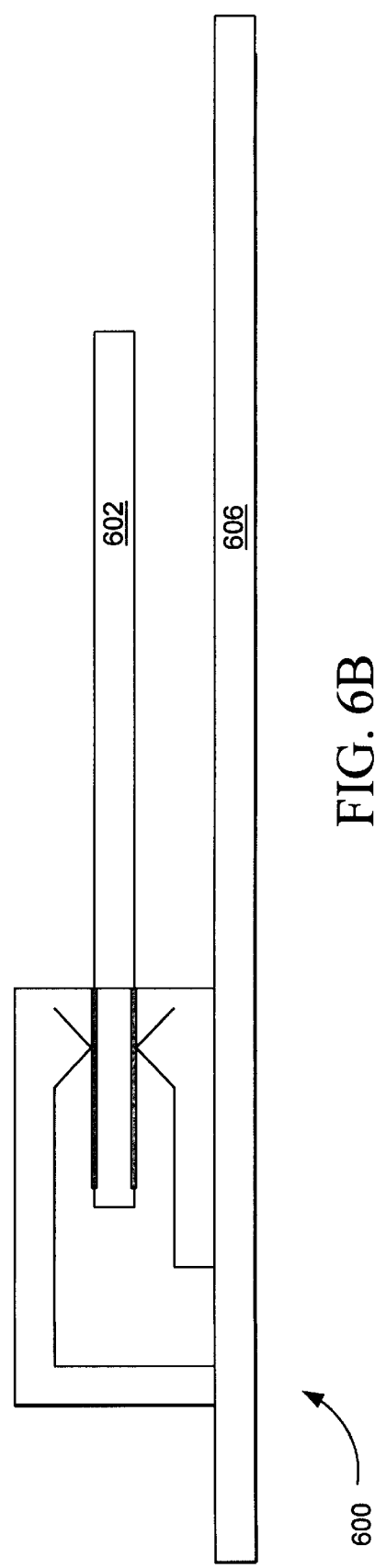
FIG. 6A
FIG. 6B

DISK DRIVE INTERFACE WITH VARIABLY SPACEABLE CONNECTORS

BACKGROUND

This invention relates to the interfacing of a disk drive with a computer system. More particularly, an apparatus and method are provided for directly interfacing disk drives having non-standard or varied spacing between their power and signal connectors.

Disk drives are often connected to a host computer system via cables—usually one set of cables or a ribbon cable for a power connection and another set for a signal connection. The installation of multiple disk drives in one computer system may lead to a Gordian knot of cables, thereby making subsequent peripheral installations or removals, or other system maintenance difficult. Further, the tangle of cables may disrupt the flow of air through the computer system (e.g., for cooling). Yet further, cables provide another point of failure in that they may break or become loose.

Thus, it could make operation of a computer system more reliable, maintenance easier and possibly reduce the cost of system manufacture if disk drives could be installed and operated without the use of conventional power and/or signal cables. However, disk drives are often constructed with non-standard power and signal connector layouts, thus making the direct connection of a disk drive to a printed circuit board (PCB) or backplane problematic. In particular, the spacing between a disk drive's power and signal connectors often varies from one drive to another and from one manufacturer to another. Although standards have been promulgated, not all drives are designed in conformance with them.

Some disk drive manufacturers attempt to reduce the number of cables needed to interface a disk drive to a computer system. Resulting drives, particularly SCSI (Small Computer System Interface) and Fibre Channel, employ Single Connector Attachments (SCA) that provide unified power and signal connections. However, many disk drives are manufactured with separate power and signal connectors instead of SCAs. Even an interposer card, which provides an SCA connector for disk drives having separate power and signal connectors, typically requires one or more cables to complete a connection between the disk drive and the interposer card.

Therefore, what is needed is an apparatus and method for directly interfacing a disk drive (having separate power and signal connectors) with a computer system, without the use of conventional power or signal cabling, wherein the apparatus can accommodate disk drives having a range of spacing (e.g., non-standard or variable) between their power and signal connectors.

SUMMARY

In one embodiment of the invention a disk drive interface assembly is provided for directly connecting to one or more disk drives and interfacing the disk drives with a computer system. More particularly, power and signal connectors of the assembly are configured to directly connect to corresponding connectors of a disk drive without requiring conventional power or signal cables or wires.

The power and/or signal connectors of the assembly are translatable (e.g., slidably movable) to allow for variable spacing between the types of connectors. Thus, disk drives having a range of spacing between their power and signal connectors can be accommodated. Any or all of the connectors may be movable in different embodiments, such as just the power connectors, just the signal connectors, a subset of the power connectors, etc.

In one embodiment of the invention, a power or signal connector may be movable only along an axis that aligns the power and signal connectors. However, in another embodiment a movable connector may be movable in two or even three dimensions.

In an embodiment of the invention in which power connectors are translatable, the assembly may comprise two or more printed circuit boards (PCB) or backplanes. In this embodiment the signal connectors are mounted on one PCB and the power connectors are mounted on one or more other boards. The signal board is situated closest to the disk drive(s) and includes a set of apertures through which the power connectors of the other board(s) may pass to meet the disk drives. As described above, within an aperture a power connector is movable in at least one dimension in order to allow for variable spacing between it and a matching signal connector.

The power and signal boards may be electrically coupled, in which case the assembly may present a combined power/signal connection interface to the computer system.

DESCRIPTION OF THE FIGURES

FIGS. 2A–2B demonstrate the variable spacing between power and signal connectors of an interface assembly in one embodiment of the invention.

FIGS. 3A–3B depict the variably spaceable power connectors of an interface assembly deployed to fit a disk drive having a first spacing between its power and signal connectors, according to one embodiment of the invention.

FIGS. 4A–4B depict the variably spaceable power connectors of an interface assembly deployed to fit a disk drive having a second spacing between its power and signal connectors, according to one embodiment of the invention.

FIGS. 6A–6B are top views of an interface assembly having variably spaceable disk drive connectors, in which a power PCB and a signal PCB are electrically interconnected, in accordance with one embodiment of the invention.

DETAILED DESCRIPTION

The following description is presented to enable any person skilled in the art to make and use the invention, and is provided in the context of particular applications of the invention and their requirements. Various modifications to the disclosed embodiments may be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

An illustrative environment in which a present embodiment of the invention is executed may incorporate a general-purpose computer or a special purpose device such as a hand-held computer. Some details of such devices (e.g., processor, memory, display) may be omitted for the sake of clarity.

In one embodiment of the invention an apparatus and methods are provided for interfacing a disk drive or other electronic device to a computer system. Advantageously, the apparatus can accommodate disk drives having a range of spacing between their power and signal connectors, both standard and non-standard. In this embodiment, one or more individual power or signal connectors on the apparatus (e.g., all power connectors or all signal connectors) are movable in at least one dimension to allow the connectors of the apparatus to meet the corresponding connectors of a disk drive. Multiple movable connectors may move individually or in concert.

Different embodiments of the invention may be implemented in different types of computer systems. In particular, however, one or more embodiments of the invention are described below in conjunction with a typical desktop or general-purpose computer employing ATA (Advanced Technology Attachment) or IDE (Integrated Drive Electronics) disk drives. One skilled in the art will appreciate that the disclosed apparatus and methods may be implemented for other types of computer systems (e.g., portable, workstation, minicomputer) and disk drives (e.g., SCSI), including magnetic and optical (e.g., CD-ROM).

Figure 1:
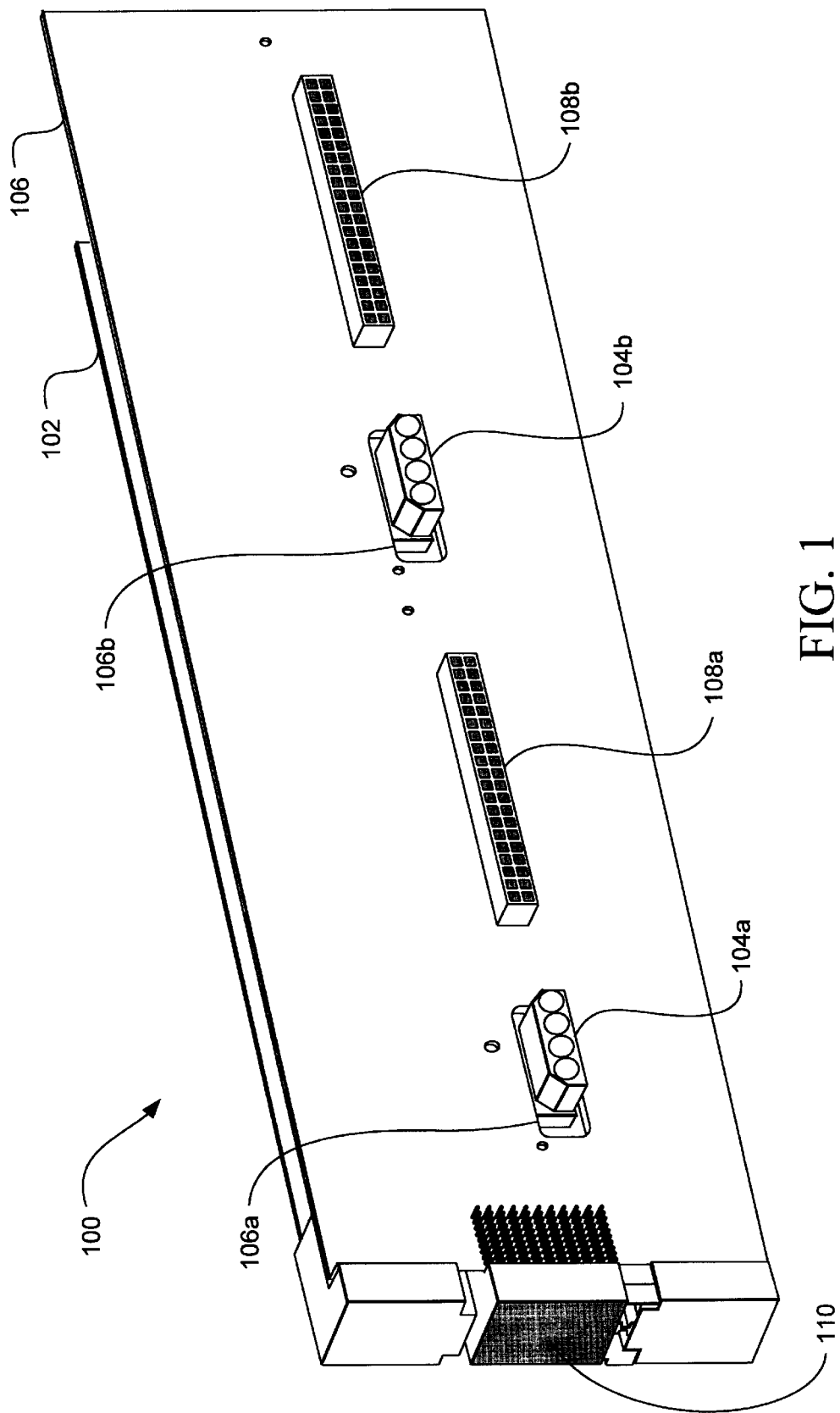
FIG. 1 depicts a disk drive interface assembly according to one embodiment of the present invention.

FIG. 1 depicts a disk drive interface apparatus having variably spaceable power and signal connectors for interfacing a disk drive according to one embodiment of the invention. In this embodiment, interface assembly 100 comprises a first printed circuit board (PCB) 102 and a second PCB 106. One or more power connectors (e.g., 104a, 104b) are mounted on PCB 102 and one or more signal connectors (e.g., 108a, 108b) are mounted on PCB 106. Thus, PCB 102 may be considered a "power PCB," a "power board," a "power panel," a "power sub-assembly," etc. Similarly, PCB 106 may be considered a "signal PCB," a "signal board," a "signal panel," a "signal sub-assembly," etc.

In interface assembly 100, power connectors 104a, 104b of power PCB 102 protrude through apertures 106a, 106b of signal PCB 106. Further, power connectors 104a, 104b are slidable or movable within their respective apertures, in at least one dimension. Thus, a power/signal combination of assembly 100 (e.g., connectors 104a and 108a) can accept a disk drive having a range of separations between its corresponding power and signal connectors.

In the illustrated embodiment the entire power PCB 102 is configured to move or slide along signal PCB 106, thus causing all power connectors to move in unison. In other embodiments of the invention, however, one or more movable connectors may move independently of other movable connectors. For example, FIG. 5A (discussed below) depicts an embodiment of the invention in which an interface assembly includes multiple rows of power and signal connectors. In such an embodiment, each row of power connectors (or, alternatively, signal connectors) may be mounted on one PCB that moves independently of another PCB.

In FIG. 1, the power and signal connectors of interface assembly 100 are female in gender, to accept the male connectors of a disk drive. In other embodiments the genders may be reversed, one or more connectors of an interface assembly may be rotated (e.g., 90 or 180 degrees) in comparison to their positions in FIG. 1 in order to accept disk drives installed in various orientations, different connectors may be employed (e.g., for different types of disk drives, for different power couplings), etc.

Thus, the power and signal connectors shown in FIG. 1 may correspond to standard power and signal connectors for ATA or IDE disk drives, but the invention is not limited to any particular type(s) of connectors or drives. And, interface assembly 100 is not limited to a particular orientation (e.g., horizontal, vertical) when installed in a computer system.

Although interface assembly 100 depicts movable power connectors and non-movable signal connectors, in other embodiments of the invention an assembly may be configured to allow either or both types of connectors to move. Further, though the power connectors illustrated in FIG. 1 are generally limited to one-dimensional translation (e.g., horizontal), in alternative embodiments of the invention a connector may be translatable in two or even three dimensions. The configuration of assembly 100, however, is well suited for use with popular ATA and IDE disk drives in which power connectors and signal connectors are aligned linearly and the power connectors are relatively deeper than the signal connectors.

As described above, apertures 106a, 106b of PCB 106 in assembly 100 are configured to allow movement of power connectors 104a, 104b along the axis in which the power and signal connectors are aligned. Thus, depending on the spacing between a disk drive's power and signal connectors, a power connector of assembly 100 may be located in any suitable position within its aperture. The size of apertures 106a, 106b may be determined by the dimensions of the power connectors and the expected range of spacing between the connectors of disk drives to be installed in the computer system and may therefore vary from one embodiment of the invention to another. Likewise, the distance between an aperture and a corresponding signal connector, such as the distance between aperture 106a and signal connector 108a, may depend upon the expected range of spacing between disk drive connectors. Therefore, in alternative embodiments of the invention an aperture may be smaller or larger, in height and/or width.

Illustratively, the PCBs comprising an interface assembly in a present embodiment of the invention are interconnected to allow for a single, consolidated, connection to a backplane, motherboard or other connection element of the host computer system. In particular, interconnect 110 of assembly 100 (shown in FIG. 1) presents combined power and signal connections to the host computer. Such interconnection of the sub-assemblies is not required, however, in which case each PCB of an interface assembly may include separate connections to the host computer.

The variable spacing of power and signal connectors in an interface assembly such as assembly 100 may be better understood with reference to FIGS. 2A–4B. FIGS. 2A, 3A and 4A are front views, and FIGS. 2B, 3B and 4B are top views, of interface assembly 200, which comprises power PCB 202 and signal PCB 206. Power connectors 204a, 204b, 204c of power PCB 202 protrude through apertures 206a, 206b, 206c of signal PCB 206, thus allowing the front ends of the power connectors and signal connectors 208a, 208b, 208c to align substantially parallel to meet a disk drive. Although FIGS. 2A–4B show the power and signal connectors aligned collinearly, in alternative embodiments of the invention the connectors may be staggered or offset.

In FIGS. 2A–2B, power connectors 204a, 204b, 204c are located approximately in the middle of their horizontal ranges of motion in apertures 206a, 206b, 206c. FIGS. 3A–3B depict the power connectors translated to one end of the apertures (e.g., to accept a disk drive having relatively wide spacing between its power and signal connectors), while FIGS. 4A–4B show the power connectors translated to the opposite end (e.g., to accommodate a disk drive having relatively narrow spacing).

Figure 5A:
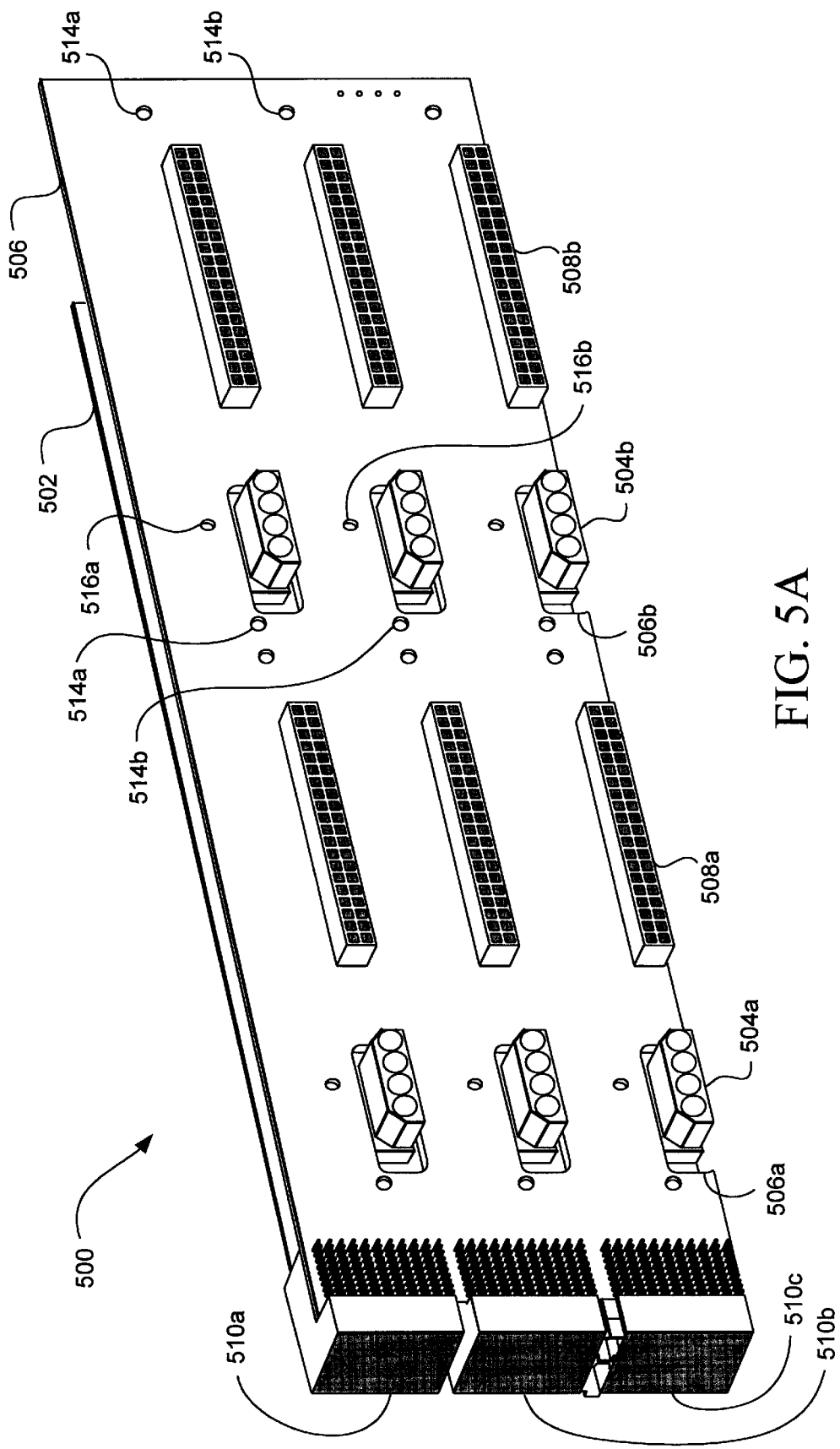
FIGS. 5A–5B are front and rear views of one alternative configuration of a disk drive interface assembly in accordance with an embodiment of the invention.
Figure 5B:
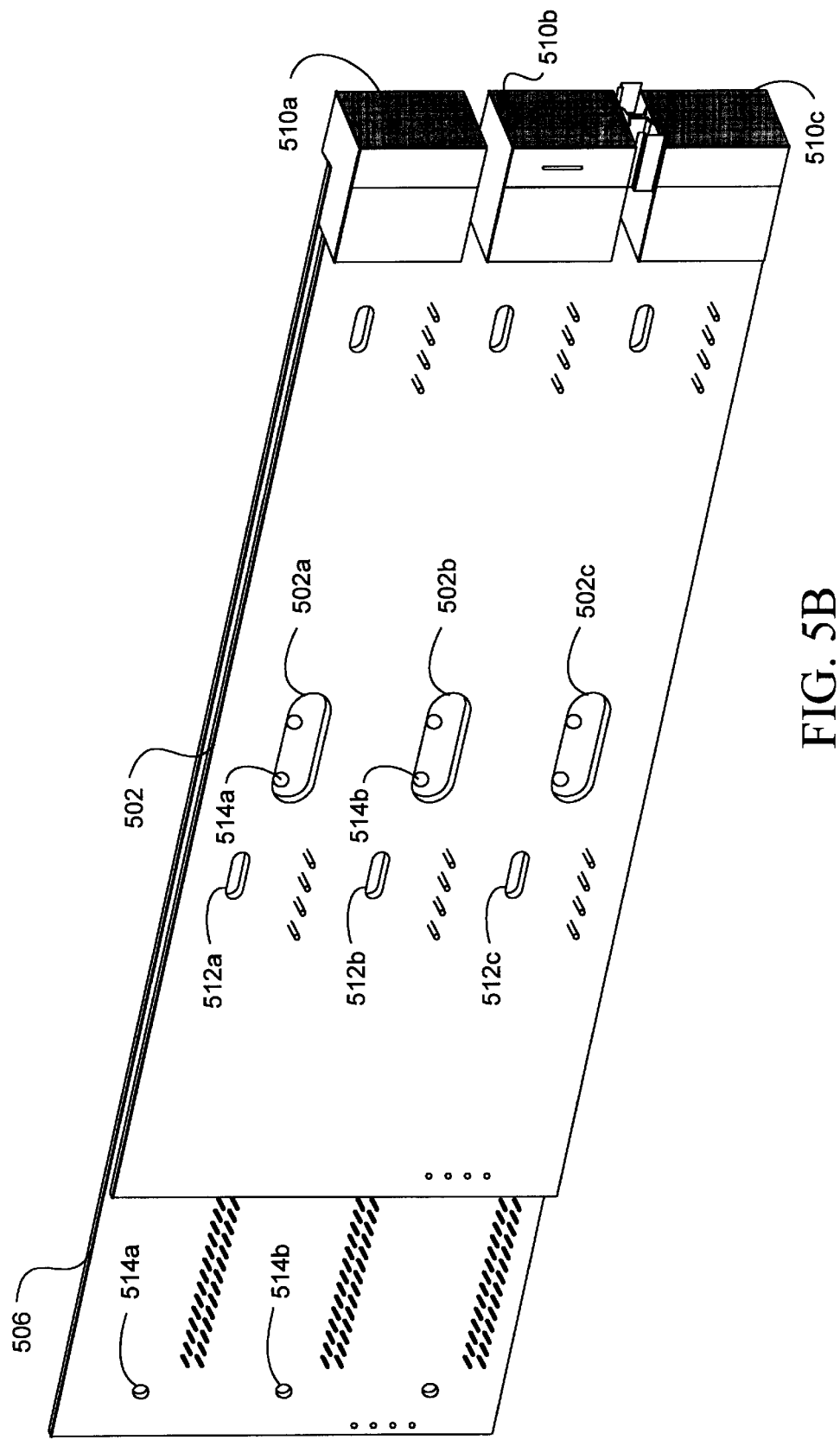

FIGS. 5A–5B depict interface assembly 500, according to another embodiment of the invention, which is configured to interface multiple rows or tiers of disk drives. Assembly 500 includes two circuit boards, power PCB 502 and signal PCB 506. Power PCB 502 includes several power connectors, such as connectors 504a, 504b. Signal PCB 506 includes several signal connectors, such as connectors 508a, 508b, and apertures (e,g., apertures 506a, 506b) for the power connectors of PCB 502. Although the movable (e.g., power) connectors of assembly 500 are mounted on a single board (shown more clearly in FIG. 5B), in alternative embodiments some of the movable connectors (e.g., each row or column) may be mounted on a different board.

The rows of connectors may be aligned, as shown in FIG. 5A, or may be staggered. For example, one row of power and signal connectors need not be aligned directly above or below another row of connectors. Each row of connectors may be electrically connected to the host computer system via a separate interconnection, such as interconnections 510a, 510b, 510c.

FIG. 5B depicts a rear view of interface assembly 500, showing possible means for securing power PCB 502 to signal PCB 506. In this embodiment, the power and signal boards are arranged for the disk drive(s) being interfaced to assembly 500. In particular, power PCB 502 is translated along signal PCB 506 until the spacing between the power and signal connectors of the assembly match the spacing between the corresponding connectors of the disk drive(s).

After the PCBs are suitably aligned, they may be secured temporarily or permanently using screws, pins, clamps or other releasable or non-releasable means. For example, power PCB 502 of interface assembly 500 includes slots 512 (e.g., 512a, 512b, 512c) through which screws may be inserted to engage the two boards. Signal PCB 506 of assembly 500 includes compatible holes 516 (e.g., 516a, 516b) corresponding to slots 512.

In one alternative embodiment of the invention, edges of the two boards may be clamped or other means may be applied to maintain a selected alignment. Once the component PCBs of an interface assembly are positioned for one disk drive, additional disk drives can be connected to the assembly as long as they have compatible spacing between their power and signal connectors and as long as the assembly has an unused pair of connectors.

Securely positioning the boards in alignment for a set of disk drives may help prevent undesired translation of movable connectors within the assembly (and resultant loss of electrical contact between the assembly and a disk drive) and thereby increase reliability of the system. The use of releasable fasteners will allow an interface assembly to be later adjusted to accommodate a disk drive having different spacing between its connectors. Conversely, the use of permanent fasteners or attachment means may provide additional reliability.

However, in one embodiment of the invention the component boards of an interface assembly may not be secured together, other than by any electrical connection that may exist (e.g., the connection between a set of power and signal connectors of the assembly and the connectors of a disk drive). In this embodiment the snug fit of the power and signal connectors of the assembly to the corresponding disk drive connectors may provide sufficient resistance to any shearing or separating force.

Besides securing the power and signal boards in position, assembly 500 may also include screw holes or other means of attachment for securing a disk drive to the assembly. Thus, screw holes 514a may be used to attach a first disk drive, holes 514b may be used for a second drive, etc. Windows 502a, 502b, 502c in power PCB 502 provide access to some of the screw holes.

To provide spacing between power PCB 502 and signal PCB 506 of assembly 500, standoffs, spacers or other means may be employed. For example, slots 512 or matching screw holes 516 in signal PCB 506 may comprise stand-offs that not only provide separation between the boards, but also provide means for securing them together.

Component boards of a disk drive interface assembly may also be separated in an embodiment of the invention by rails, tracks or other means for guiding or moving one PCB along, across or in relation to another. Such rails may be installed on one or more boards of an interface assembly.

FIGS. 6A–6B demonstrate one manner in which two PCBs or backplanes of an interface assembly may be electrically coupled, according to one embodiment of the invention. Electrically coupling the PCBs may allow the assembly to present a common connection element to the host computer system, as shown by connection 110 of assembly 100 in FIG. 1.

FIGS. 6A–6B are top views of interface assembly 600, which includes power backplane 602 and signal backplane 606. FIG. 6A depicts power backplane 602 positioned for one or more disk drives having a first spacing between their power and signal connectors, while FIG. 6B depicts power backplane 602 positioned for a disk drive having a second (e.g., closer) spacing. The power and signal connectors of the power and signal backplanes are omitted for clarity.

In this embodiment of the invention, housing 610 is attached to signal backplane 606 and provides power to power backplane 602 via housing contacts 612 and backplane contacts 614. Backplane contacts 614 are elongated in order to slidably contact housing contacts 612 as the power backplane is laterally translated to fit disk drives having different spacings between their power and signal connectors. Illustratively, the depth of housing 610 is sufficient to allow the power connectors of power backplane 602 to be fully translated from one end to the other of the cooperating apertures of the signal backplane (not shown in FIGS. 6A–6B).

With an electrical interconnection such as provided for in FIGS. 6A–6B, a disk drive interface assembly can provide a consolidated electrical connection (e.g., power and signal) to a host computer system.

In one alternative embodiment of the invention, electrical contact between two boards of an interface assembly may be accomplished through the use of one or more pins (e.g., rather than a "finger" as shown in FIGS. 6A–6B) or other conductors. As shown in FIGS. 6A–6B, however, the electrical contact should be maintainable as the movable board is translated to accommodate disk drives having different power/signal connector spacing. As yet another alternative, cabling or a flexible electrical conductor could be employed to interconnect multiple boards of a disk drive interface assembly. A flexible conductor, for example, would bend, flex or extend to maintain contact between the boards as one is moved relative to another.

The foregoing descriptions of embodiments of the invention have been presented for purposes of illustration and description only. They are not intended to be exhaustive or to limit the invention to the forms disclosed. Accordingly, the above disclosure is not intended to limit the invention; the scope of the invention is defined by the appended claims.

What is claimed is:

1. A backplane assembly configured to interface one or more disk drives with a computer system, comprising:
   a first panel comprising a first set of power connectors configured for direct connection to a first set of disk drives; and
   a second panel comprising a first set of signal connectors configured for direct connection to said first set of disk drives;
   wherein a distance of separation between first power connector of said first panel and a first signal connector of said second panel for interfacing a first disk drive in said set of disk drives is dynamically adjustable.

2. The backplane assembly of claim 1, wherein said first panel is a first circuit board and said second panel is a second circuit board.

3. The backplane assembly of claim 1, wherein said first panel is electrically coupled to said second panel.

4. The backplane assembly of claim 1, wherein said second panel further comprises a first aperture, and wherein said first power connector connects to the first disk drive, from said first panel, through said first aperture.

5. The backplane assembly of claim 4, wherein said first power connector is movable within said first aperture in at least one dimension.

6. The backplane assembly of claim 1, wherein said first panel further comprises a first aperture, and wherein said first signal connector connects to the first disk drive, from said second panel, through said first aperture.

7. The backplane assembly of claim 6, wherein said first signal connector is movable within said first aperture in at least one dimension.

8. The backplane assembly of claim 1, wherein said first power connector and said first signal connector are separated by a first distance, and
   wherein a second power connector and a second signal connector directly coupled to a second disk drive are separated by a second distance different than said first distance.

9. The backplane assembly of claim 1, further comprising:
   a third panel comprising a second set of power connectors configured for direct connection to a second set of disk drives;
   wherein said first set of signal connectors is further configured for direct coupling to said second set of disk drives.

10. The backplane assembly of claim 1, further comprising:
    a third panel comprising a second set of signal connectors configured for direct connection to a second set of disk drives;
    wherein said first set of power connectors is further configured for direct coupling to said second set of disk drives.

11. An assembly for providing direct power and signal connections to one or more electronic devices, the assembly comprising:
    a power board comprising a set of power connectors configured for direct connection to power connectors of a set of electronic devices; and
    a signal board comprising a set of signal connectors configured for direct connection to signal connectors of the set of devices;
    wherein the distance of separation between each said power connector in said set of power connectors and a corresponding signal connector in said set of signal connectors is dynamically adjustable to accommodate the distance of separation between a power connector and a signal connector of a first device in the set of devices.

12. The assembly of claim 11, wherein said signal board further comprises a set of apertures, and wherein a first power connector in said set of power connectors penetrates a first aperture of said set of apertures to directly connect to a first device in the set of devices.

13. The assembly of claim 11, wherein said power board further comprises a set of apertures, and wherein a first signal connector in said set of signal connectors penetrates a first aperture of said set of apertures to directly connect to a first device in the set of devices.

14. A disk drive interface assembly for direct connection to one or more disk drives, comprising:
    a power component comprising a set of power connectors configured to directly connect to disk drive power connectors; and
    a signal component comprising:
      a set of signal connectors configured to directly connect to disk drive signal connectors; and
      a set of apertures configured to receive said power connectors;
    wherein said power connectors are movable within said apertures to provide variable spacing between said power connectors and said signal connectors.

15. The interface assembly of claim 14, wherein said power component is movable relative to said signal component, and said power connectors move within said apertures in unison as said power component is moved.

16. The interface assembly of claim 14, wherein said power component comprises one or more power boards;
    wherein each of said power boards comprises a subset of said power connectors;
    wherein one or more of said power boards are movable relative to said signal component; and
    each said subset of power connectors move within said apertures in accordance with movement of said corresponding power board.

17. The interface assembly of claim 14, wherein said power connectors and said signal connectors are aligned along an axis, and wherein said apertures are configured to allow said power connectors to move along said axis.

18. The interface assembly of claim 14, wherein said power component is movable in multiple dimensions relative to said signal component.

19. The interface assembly of claim 14, wherein said power component and said signal component are electrically coupled, the assembly further comprising:
    an interconnection providing a combined power and signal interface for a host computer.

20. A method of directly interfacing a disk drive to a computer system, comprising:
    installing a disk drive interface assembly in the computer system, said interface assembly comprising:
      a power board comprising power connectors; and
      a signal board comprising signal connectors;
      wherein said power connectors and said signal connectors are variably spaceable;
    adjusting said interface assembly to define a first separation between a first power connector of said interface assembly and a first signal connector of said interface assembly, said first separation substantially matching the separation between a power connector and a signal connector of a first disk drive;

directly connecting said first power connector to the power connector of the first disk drive; and directly connecting said first signal connector to the signal connector of the first disk drive.

21. The method of claim 20, wherein said directly connecting said first power connector comprises directly connecting said first power connector to the power connector of the first disk drive through an aperture defined by said signal board.

22. The method of claim 20, wherein said directly connecting said first signal connector comprises directly connecting said first signal connector to the signal connector of the first disk drive through an aperture defined by said power board.

23. The method of claim 20, further comprising coupling said interface assembly to the computer system through a combined power/signal interconnection.

24. A computer system, comprising:

a set of disk drives; and a disk drive interface assembly comprising a set of power connectors and a set of signal connectors, wherein one of said power connectors and said signal connectors is movable relative to the other;

wherein a distance between a first power connector and a first signal connector is dynamically adjustable to directly connect said interface assembly to a first disk drive without using cables between said first disk drive and said first power and first signal connectors.

25. The computer system of claim 24, wherein said first power connector is mounted on a power board and said first signal connector is mounted on a signal board, and wherein said signal board comprises an aperture through which said first power connector connects to the first disk drive.

26. The computer system of claim 24, wherein said first power connector is mounted on a power board and said first signal connector is mounted on a signal board, and wherein said power board comprises an aperture through which said first signal connector connects to the first disk drive.

* * * * *